(12) United States Patent
Hooper et al.

(10) Patent No.: US 7,834,431 B2
(45) Date of Patent: Nov. 16, 2010

(54) LEADFRAME FOR PACKAGED ELECTRONIC DEVICE WITH ENHANCED MOLD LOCKING CAPABILITY

(75) Inventors: Stephen R. Hooper, Mesa, AZ (US); James D. MacDonald, Chandler, AZ (US); Russell S. Shumway, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 220 days.

(21) Appl. No.: 12/099,446

(22) Filed: Apr. 8, 2008

(65) Prior Publication Data

US 2009/0250795 A1   Oct. 8, 2009

(51) Int. Cl.
*H01L 23/495* (2006.01)

(52) U.S. Cl. ............... 257/667; 257/676; 257/E23.037; 257/E23.05

(58) Field of Classification Search ................. 257/667, 257/676, E23.037, E23.05
See application file for complete search history.

(56) References Cited

U.S. PATENT DOCUMENTS

| | | | |
|---|---|---|---|
| 5,126,820 A * | 6/1992 | Brown | 257/420 |
| 6,630,728 B2 | 10/2003 | Glenn | |
| 6,965,157 B1 | 11/2005 | Perez et al. | |
| 6,984,878 B2 | 1/2006 | Park et al. | |
| 7,091,602 B2 | 8/2006 | Elliott et al. | |
| 7,205,180 B1 | 4/2007 | Sirinorakul et al. | |
| 7,211,467 B2 | 5/2007 | Park et al | |
| 7,217,599 B2 | 5/2007 | Punzalan et al. | |
| 2002/0033530 A1* | 3/2002 | Sakamoto et al. | 257/729 |
| 2002/0163015 A1* | 11/2002 | Lee et al. | 257/200 |
| 2008/0079127 A1* | 4/2008 | Gerber | 257/676 |

OTHER PUBLICATIONS

PCT Search Report and Written Opinion, PCT/US2009/034073, Mailed Jul. 23, 2009.

* cited by examiner

*Primary Examiner*—Tu-Tu V Ho
(74) *Attorney, Agent, or Firm*—Meschkow & Gresham, P.L.C.

(57) ABSTRACT

A packaged electronic device (20) includes a die pad (30), leads (32) arranged around the die pad (30), and a die (24) attached to an upper surface (34) of the die pad (30) and electrically connected to the leads (32). A packaging material (28) encapsulates the die pad (30), the die (24), and the leads (32). The die pad (30) includes indentations (42) formed in the upper surface (34) along a sidewall (38) of the die pad (30). The die pad (30) further includes indentations (44) formed in a lower surface (36) of the die pad (30) along the sidewall. The packaging material (28) fills the indentations (42, 44) thereby promoting adhesion between the die pad (30) and the packaging material (28) so that the die pad (30) and packaging material (28) cannot readily delaminate.

11 Claims, 3 Drawing Sheets

LEADFRAME FOR PACKAGED ELECTRONIC DEVICE WITH ENHANCED MOLD LOCKING CAPABILITY

TECHNICAL FIELD OF THE INVENTION

The present invention relates generally to a leadframe for a packaged electronic device. More specifically, the present invention relates to a leadframe with a die pad having enhanced mold locking capability.

BACKGROUND OF THE INVENTION

Electrical circuits such as integrated circuits can be implemented in packaged electronic devices. The elements of a packaged electronic device generally include one or more metal leadframes, one or more integrated circuit die, bonding material to attach the integrated circuit die to a die pad of the leadframe, bonding wires which electrically connect pads on the die to individual leads of the leadframe, and a hard plastic packaging material, or encapsulant, which covers the other components and forms the exterior of the packaged electronic device. The packaging material, or encapsulant, provides protection from hostile environments and can provide structural support for electrical interconnections between the die and a printed circuit board.

The leadframe is the central supporting structure of such a package. A portion of the leadframe is internal to the package, i.e., completely surrounded by the packaging material. Portions of the leads of the leadframe may extend eternally from the package and are used to connect the package externally. A quad flat no leads (QFN) package is an integrated circuit package with surface mounted printed circuit boards. In this type of integrated circuit package, the leads do not extend externally from the package. Rather, lead contacts of the leadframe are exposed out of the bottom surface of the packaged electronic device for connection to outside components. As such, the leadframe used in a QFN integrated circuit device is sometimes referred to as a leadless leadframe. A leadless leadframe can be implemented in an integrated circuit package at lower manufacturing cost, with smaller dimensions, and with shorter electrical paths than conventional leadframes.

Reflow soldering is a common process for attaching a surface mounted component such a packaged electronic device to a circuit board. During reflow soldering, a packaged electronic device can be subjected to elevated temperatures of up to, for example, 260° C. Temperature variations, such as those encountered during a reflow process, may cause the packaged die to be stressed during manufacture. The stress is due to differences in thermal expansion and other material properties of the dissimilar materials (e.g. metal, packaging material, and so forth) used in packaging of the integrated circuit. This stress can result in delamination of the die pad and/or leads of a leadless leadframe from the packaging material. In particular, the sidewall of the die pad may encounter high thermal stress in the horizontal direction that results in delamination from the packaging material.

Some prior art leadless leadframe designs call for a metal layer plated to a top surface of the leadless leadframe. This metal layer may include an opening which exposes the die attach area of the die pad for attaching an integrated circuit die. The metal layer may function to enhance the wire-bonding connection of bonding wires between the integrated circuit pads and the leads. Unfortunately, this metal layer can exacerbate delamination of the die pad and leads from the packaging material due to further differences in thermal expansion and other material properties of the materials of the die pad, the packaging material, and the added metal layer.

Delamination of the leadless leadframe from the packaging material during manufacture and/or under operating conditions may adversely affect operation of the packaged electronic device.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
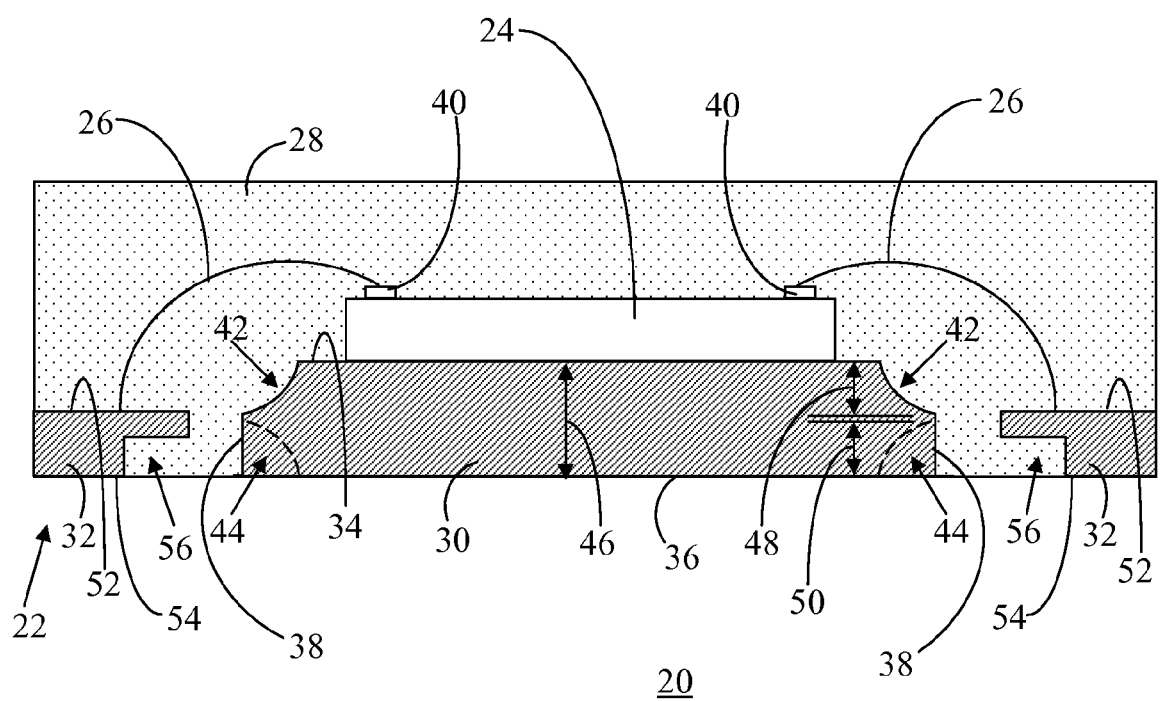
FIG. 1 shows cross-sectional side view of a packaged electronic device in accordance with an embodiment of the present invention.
Figure 2:
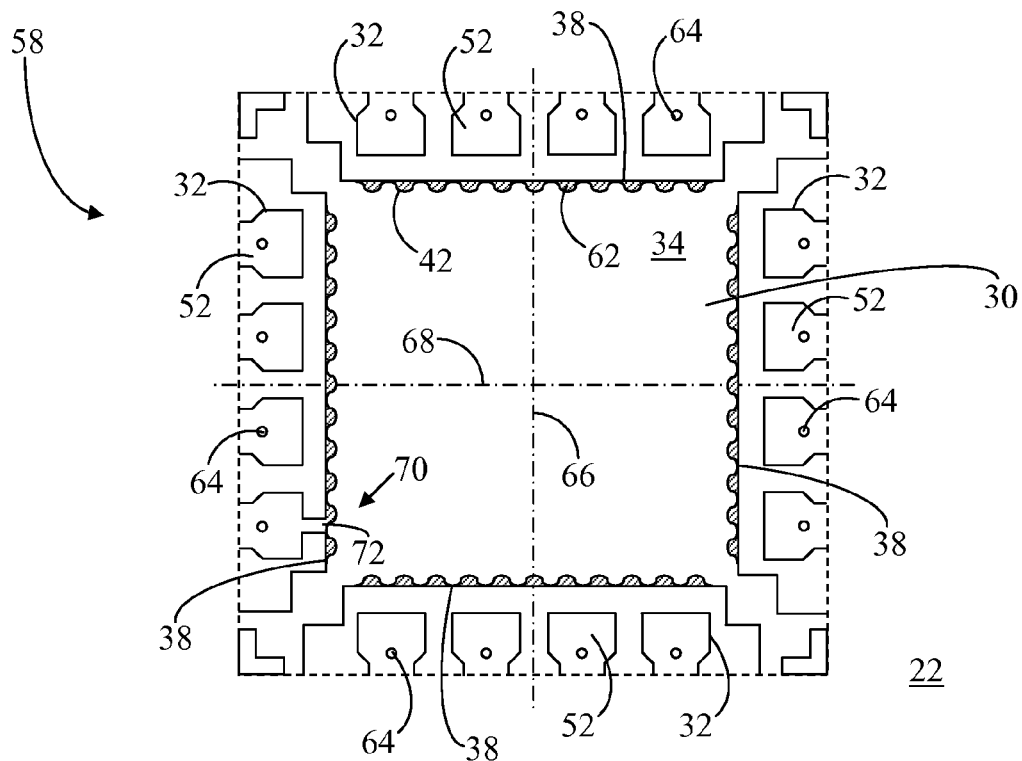
FIG. 2 shows a top view of a leadframe of the packaged electronic device of FIG. 1.
Figure 3:
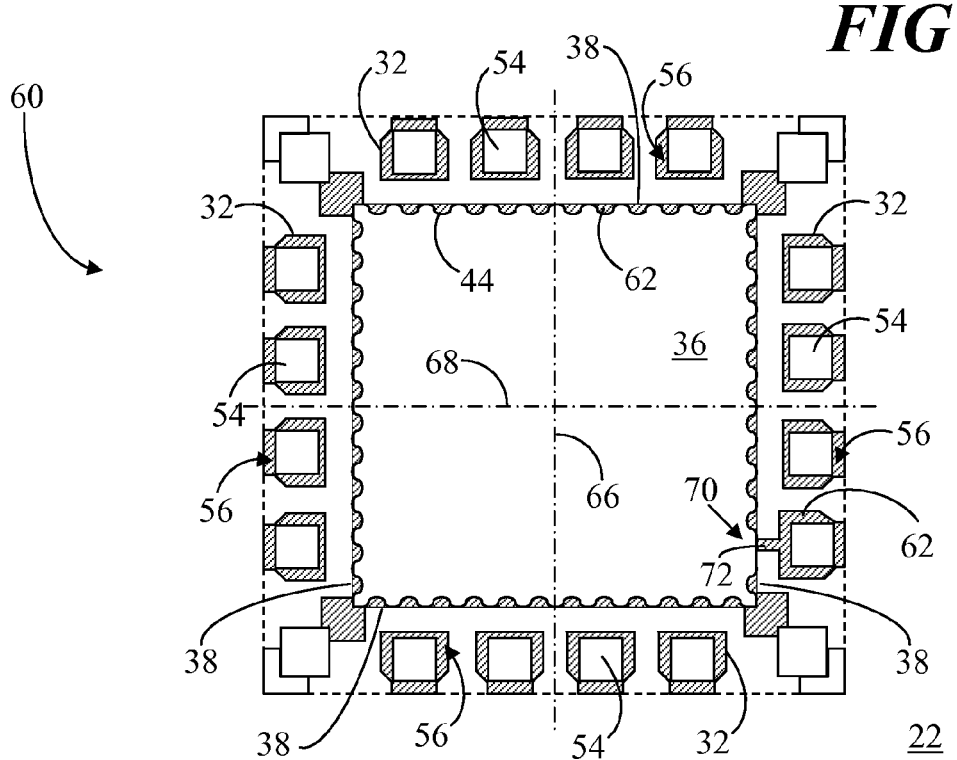
FIG. 3 shows a bottom view of the leadframe.

FIG. 1 shows cross-sectional side view of a packaged electronic device 20 in accordance with an embodiment of the present invention. Packaged electronic device 20 includes a leadless leadframe 22, an integrated circuit die 24, bonding wires 26, and a packaging material 28 encapsulating leadframe 22, die 24, and bonding wires 26. Leadless leadframe 22 includes a die pad 30 and leads 32 arranged around die pad 30 (as best seen in FIGS. 2 and 3). Die pad 30, sometimes referred to as a flag structure, has an upper surface 34, a lower surface 36, and a sidewall 38 delineating die pad 30 and extending between upper and lower surfaces 34 and 36. Die 24 is attached to upper surface 34 of die pad 30. Bonding wires 26 connect pads 40 of integrated circuit die 24 to leads 32. As will be discussed in greater detail below, leadless leadframe 22 of packaged electronic device 20 has enhanced mold locking capability so that leadframe 22 cannot readily delaminate from packaging material 28.

Indentations 42 are formed in upper surface 34 of die pad 30 along sidewall 38. Similarly, indentations 44 are formed in lower surface 36 of die pad 30 along sidewall 38. In one embodiment, indentations 42 and 44 are at corners of die pad 30, at the intersections of respective upper and lower surfaces 34 and 36, respectively, and sidewall 38. Indentations 44 extending into die pad 30 from lower surface 36 are offset along sidewall 38 relative to indentations 42 extending into die pad 30 from upper surface 34. Consequently, indentations 42 are illustrated in FIG. 1 as semi-circular shaped notches in upper surface 34. However, due to their offset, indentations 44 are not actually visible in FIG. 1. Rather, indentations 44 are represented by dashed, semi-circular lines in FIG. 1 to illustrate their extension into die pad 30 from lower surface 36. Indentations 42 and 44 will be discussed in detail below.

Die pad 30 exhibits a thickness 46. Indentations 42 extend into die pad 30 from upper surface 34 by a depth 48 that is less than thickness 46. Similarly, indentations 44 extend into die pad 30 from lower surface 36 by a depth 50 that is also less than thickness 46. In one embodiment, depth 48 and depth 50 may be substantially equal. For example, each of depths 48 and 50 may be approximately one half of thickness 46 of die pad 30. However, due to their offset positioning on upper and lower surfaces 34 and 36, indentations 42 and 44 do not intersect.

Indentations 42 and 44 are semi-circular in shape and extend generally vertically from respective upper and lower surfaces 34 and 36. In alternative embodiments, indentations 42 and 44 may be other shapes, such as a zigzag or sawtooth shape, rectangular shaped, or some combination thereof. Packaging material 28 fills indentations 42 and 44. Thus, the combination of indentations 42 and 44 on both upper and lower surfaces 34 and 36 of die pad 30 enhance mold locking capability of die pad 30 so that packaging material 28 is less likely to become delaminated from die pad 30. The term "mold locking capability" is used herein to refer to the structural features of die pad 30 that facilitate adherence of packaging material 28 with die pad 30 so that delamination of packaging material 28 from die pad 30 cannot readily occur.

Leads 32 include a top surface 52 and a bottom surface 54. Bonding wires 26 connect to top surface 52, whereas, bottom surface 54 functions as a lead contact region for each of leads 32. It should be noted that lower surface 36 of die pad 30 and bottom surface 54 of each of leads 32 are exposed out of packaging material 28. Thus, when mounted to another structure, such as a printed circuit board, lower surface 36 of die pad 30 may attach to, for example, a ground plane. In addition, bottom surface 54 of each of leads 32 may attach to underlying traces (not shown) so as to form electrical interconnects between leads 32 and components external to packaged electronic device 20.

Packaged electronic device 20 is shown as including bonding wires 26 that connect integrated circuit die 24 with leads 32. In an alternative embodiment, leadless leadframe 22 can be utilized for packaging a flip chip or another type of package. In a flip chip package, die 24 may be a flip chip that is flip-chip mounted onto die pad 30. For example, bumps may be attached onto the flip chip die. When the flip chip is fixed to die pad 30, these bumps directly contact and attach to leads 32.

Leads 32 include a half-etching portion 56 on bottom surface 54. That is, half-etching portion 56 is an area of removed material of leadframe 22. Thus, an area of top surface 52 of each of leads 32 is larger than the area of bottom surface 54. Packaging material 28 fills half-etching portion 56 thereby facilitating mold locking of leads 32 so that leads 32 are less likely to become delaminated from packaging material 28.

It should be noted that packaging material 28 encapsulates die pad 30 and leads 32 of leadframe 22 in the absence of an intervening metal layer. That is, leadframe 22 of packaged electronic device 20 is not plated with a metal layer, thus preventing the delamination of leadframe 22 and packaging material 28 as may occur in prior art devices that include the plated metal layer.

Referring to FIGS. 2 and 3, FIG. 2 shows a top view 58 of leadframe 22 of packaged electronic device 20 (FIG. 1) and FIG. 3 shows a bottom view 60 of leadframe 22. Leadframe 22 is formed from a sheet (not shown) of suitable leadframe material (e.g. copper) using any of a number of forming processes. In forming one embodiment of a leadframe, the sheet of leadframe material is stamped and/or chemically etched with a pattern that includes patterns for multiple leadframes (e.g., leadframes 22). In some embodiments, the leadframe patterns are arranged in columns and rows in the sheet.

Top view 58 shows upper surface 34 of die pad 30 and top surface 52 of leads 32. Indentations 42 are visible extending into die pad 30 from upper surface 34. Since indentations 42 do not extend through the entire thickness 46 (FIG. 1) of die pad 30, an underlying material portion 62 of die pad 30 is visible through indentations 42, as represented by cross-hatching. Leads 32 may additionally have a mold locking hole 64 in top surface 52 thereof. Mold locking hole 64 fills with packaging material 28, again for the purpose of enhancing the mold locking capability of leads 32.

Bottom view 60 shows lower surface 36 of die pad 30 and bottom surface 54 of leads 32. Indentations 44 are visible extending into die pad 30 from lower surface 36. Since indentations 44 do not extend through the entire thickness 46 (FIG. 1) of die pad 30, underlying material portion 62 of die pad 30 is visible through indentations 44, as represented by cross-hatching. Half-etching portion 56 is also visible in bottom view 60. Half-etching portion 56 about each of leads 32 is visible extending into die pad 30 from lower surface 36. Since half-etching portion 56 does not extend through the entire thickness 46 of die pad 30, underlying material portion 62 of die pad 30 is visible through half-etching portion 56, as represented by cross-hatching.

Top and bottom views 58 and 60 reveal the offset arrangement of indentations 42 and 44. A vertical centerline 66 and a horizontal centerline 68 are shown in each of top and bottom views 58 and 60. As shown, there is an uneven quantity of approximately equally spaced indentations 42 in upper surface 34 of die pad 30, with a centermost one of indentations 42 along each sidewall 38 being centered with the corresponding vertical and horizontal centerlines 66 and 68. Conversely, there is an even quantity of approximately equally spaced indentations 44 in lower surface 36 of die pad 30. Thus, none of indentations 44 are centered at corresponding vertical and horizontal centerlines 66 and 68. Instead, indentations 44 are offset from centerlines 66 and 68 with an even number of indentations 44 on either side of centerlines 66 and 68. One exception to the arrangement is at a location 70 at which a tab 72 portion of one of leads 32 interconnects with die pad 30.

Figure 4:
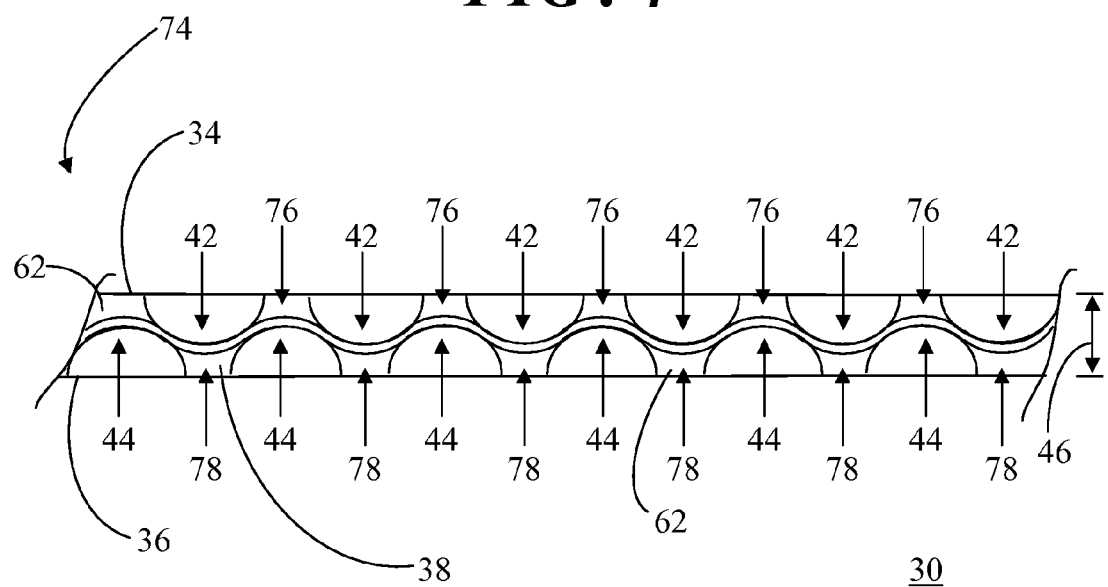
FIG. 4 shows a partial side view of a sidewall of a die pad of the leadframe of FIG. 2.

FIG. 4 shows a partial side view 74 of sidewall 38 of die pad 30 of leadframe 22 (FIG. 2). In particular, partial side view 74 reveals the offset arrangement of indentations 44 relative to indentations 42. Indentations 42 extend into die pad 30 from upper surface 34 and indentations 44 extend into die pad 30 from lower surface 36. Projections 76 of material portion 62 of die pad 30 extend from upper surface 34 through approximately one half of thickness 46 of die pad 30. Likewise, projections 78 of material portion 62 of die pad 30 extend from lower surface 36 through approximately one half of thickness 46 of die pad 30. As such, material portion 62 in the form of projections 78 extend between indentations 42 and lower surface 36 of die pad 30. Likewise, material portion 62 in the form of projections 76 extend between indentations 44 and upper surface 34 of die pad 30. Thus, leadframe 22 (FIG. 1) includes die pad 30 with alternating indentations 42 and projections 76 half-etched into upper surface 34, and with alternating indentations 44 and projections 78 half-etched into lower surface 36. Projections 76 alternate with projections 78, and indentations 42 alternate with indentations 44 to form an "alternating sine wave" structure along sidewall 38.

Figure 5:
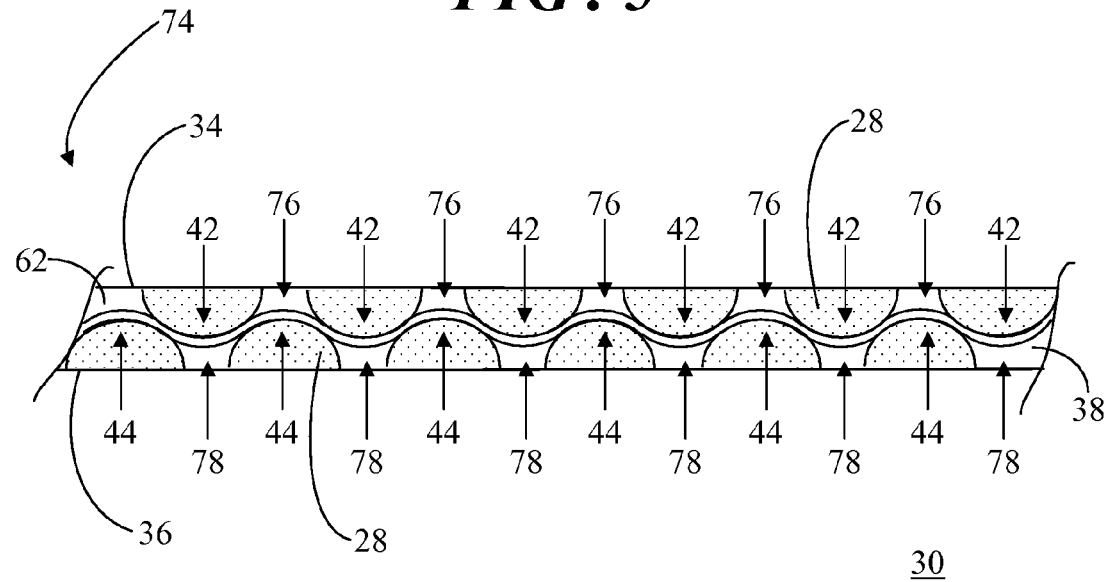
FIG. 5 shows a partial side view of the sidewall of the die pad in which packaging material has filled indentations of the die pad.

FIG. 5 shows partial side view 74 of sidewall 38 of die pad 30 in which packaging material 28 has filled indentations 42 and 44. The "alternating sine wave" structure of indentations 42 and 44 maximizes the surface area along sidewall 38 to promote adhesion of die pad 30 with packaging material 28 so that die pad 30 cannot readily move vertically or laterally, and therefore cannot easily delaminate. In addition, a moisture ingress path from outside of packaged electronic device 20 to integrated circuit die 24 (FIG. 1) along a sidewall 38 has been maximized by the "alternating sine wave" structure of indentations 42 and 44 and projections 76 and 78. It is desirable to limit the amount of moisture that can reach integrated circuit die 24 so as to prolong the operability of integrated circuit die 24. By maximizing the moisture ingress path, i.e., by making the moisture ingress path longer, it may take longer for moisture to reach integrated circuit die 24 relative to prior art designs thereby prolonging the operability of die 24.

An embodiment described herein comprises a leadframe for a packaged electronic device that includes indentations formed in the upper surface of a die pad and indentations formed in a lower surface of the die pad along a sidewall of the die pad. The indentations alternate with projections of a material portion of the die pad. A die pad having a mold locking feature of indentations on both the top and the bottom of the die pad maximizes surface area to promote adhesion between the die pad and the packaging material. This adhesion enhances the mold locking capability of the die pad so that die pad is significantly limited in movement both vertically and horizontally, and therefore cannot readily delaminate.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A leadframe for a packaged electronic device comprising:
a die pad having an upper surface, a lower surface, and a sidewall, said die pad exhibiting a thickness, said die pad including first indentations formed in said upper surface along said sidewall and second indentations formed in said lower surface along said sidewall, wherein each of said first and second indentations exhibits a three-dimensional continuously curved shape, said first indentations extend into said die pad from said upper surface by a first depth that is approximately one half of said thickness, and said second indentations extend into said die pad from said lower surface by a second depth that is approximately one half of said thickness; and
leads arranged around said die pad.

2. A leadframe as claimed in claim 1 wherein said first depth of said first indentations and said second depth of said second indentations are substantially equivalent.

3. A leadframe for a packaged electronic device comprising:
a die pad having an upper surface, a lower surface, and a sidewall, said die pad including first indentations formed in said upper surface along said sidewall and second indentations formed in said lower surface along said sidewall, wherein each of said first and second indentations exhibits a three-dimensional continuously curved shape, each of said first and second indentations are in a semi-circular shape in a first direction substantially parallel to said sidewall, and said each of said first and second indentations are in a quarter-circular shape in a second direction substantially perpendicular to said sidewall; and
leads arranged around said die pad.

4. A leadframe as claimed in claim 1 wherein said first and second indentations are at corners of said die pad at intersections of respective upper and lower surface with said sidewall.

5. A leadframe as claimed in claim 1 wherein said second indentations extending into said die pad from said lower surface are offset along said sidewall relative to said first indentations extending into said die pad from said upper surface.

6. A leadframe as claimed in claim 5 wherein a material portion of said die pad extends between said first indentations and said lower surface and said material portion of said die pad extends between said second indentations and said upper surface.

7. A leadframe as claimed in claim 1 wherein a material portion of said die pad extends between each of said first indentations and said material portion of said die pad extends between each of said second indentations.

8. A leadframe for a packaged electronic device comprising:
a die pad having an upper surface, a lower surface, and a sidewall, said die pad exhibiting a thickness, said die pad including first indentations and second indentations, said first indentations being formed on said upper surface along said sidewall and extending into said die pad from said upper surface by a first depth that is approximately one half of said thickness, said second indentations being formed on said lower surface along said sidewall and extending into said die pad from said lower surface by a second depth that is approximately one half of said thickness, said second indentations being offset along said sidewall relative to said first indentations, wherein each of said first and second indentations exhibits a three-dimensional continuously curved shape; and
leads arranged around said die pad.

9. A leadframe as claimed in claim 8 wherein each of said first and second indentations are in a semi-circular shape in a first direction substantially parallel to said sidewall, and said each of said first and second indentations are in a quarter-circular shape in a second direction substantially perpendicular to said sidewall.

10. A leadframe as claimed in claim 8 wherein a material portion of said die pad extends between said first indentations and said lower surface and said material portion of said die pad extends between said second indentations and said upper surface.

11. A leadframe as claimed in claim 8 wherein a material portion of said die pad extends between each of said first indentations and said material portion of said die pad extends between each of said second indentations.

* * * * *